(12) United States Patent
Dobrovolny

(10) Patent No.: US 6,472,957 B1
(45) Date of Patent: Oct. 29, 2002

(54) LOW POWER SWITCHABLE FILTER TUNER

(75) Inventor: Pierre Dobrovolny, North Riverside, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/940,759

(22) Filed: Aug. 28, 2001

(51) Int. Cl.[7] .................................................. H03H 7/12
(52) U.S. Cl. ....................................... 333/174; 333/176
(58) Field of Search ................................. 333/174, 176, 333/172; 455/188.1, 180.1, 180

(56) References Cited

U.S. PATENT DOCUMENTS

| | | | |
|---|---|---|---|
| 4,153,887 A | * 5/1979 | Poppa | 333/172 |
| 4,571,560 A | 2/1986 | Dobrovolny | 333/174 |
| 4,573,211 A | * 2/1986 | Kupfer | 455/188.1 |
| 5,483,209 A | * 1/1996 | Takayama | 333/174 |
| 6,044,251 A | * 3/2000 | Brekelmans | 455/150.1 |

* cited by examiner

Primary Examiner—Patrick Wamsley

(57) ABSTRACT

A switchable filter for passing one of a plurality of frequency bands has n bandpass filter sections coupled in parallel between a filter input terminal and a filter output terminal. Each of the n bandpass filter sections is arranged to pass a different frequency band. Each of n switches is coupled to a respective one of the n bandpass filter sections, and each of the n switches is operable in either an OFF state for activating a corresponding one of the n bandpass filter sections or an ON state for deactivating the corresponding one of the n bandpass filter sections. The n switches are arranged and controlled so that, when any one of then switches is operated to its off state, the remaining n−1 switches are operated to their ON states and form a series circuit for conducting a common current.

35 Claims, 3 Drawing Sheets

LOW POWER SWITCHABLE FILTER TUNER

TECHNICAL FIELD OF THE INVENTION

The present invention relates generally to bandpass filters and is particularly directed to a switchable bandpass filter for processing a wide band RF signal particularly adapted for use in a frequency converter.

BACKGROUND OF THE INVENTION

An electronic tuner such as used in atypical RF receiver includes up to three tunable circuits, i.e., a tunable circuit between the antenna input and the RF amplifier, a tunable circuit between the RF amplifier and the mixer, and a tunable circuit associated with the oscillator. Each of these tunable circuits is simultaneously tuned to a frequency representing the desired station, or channel. When more than one octave of frequencies is to be covered by the tuner, band switching techniques are frequently used to selectively change some elements of each tunable circuit in order to accommodate the entire desired frequency band.

Also, many tuners or frequency converters, such as for example those used with CATV systems, operate without a selective front end or mixer protection. As the desired RF bandwidth in this case increases over an octave of frequencies, the number of intermodulation products and the possibility of crossmodulation products quickly increase, imposing greater demands upon tuner.

Prior art approaches to multi-band tuning and mixer protection have generally involved the use of varactor diodes and/or switching diodes in the tuning stages. The varactor diode approach makes use of circuit elements that exhibit capacitances which are functions of the applied voltage. By varying the DC tuning voltage applied to a varactor diode, its capacitance changes, and the frequency to which the resonant circuit is tuned may be thereby adjusted within approximately one octave frequency range as desired. The limitation of the varactor tuning range to approximately one octave is overcome frequently by means of switching diodes forming a tuned and bandswitched network together with the varactor diodes and other mostly inductive components.

Another limitation to this varactor diode approach arises from an inherent characteristic of a varactor diode. Specifically, a varactor diode exhibits a nonlinear variation in capacitance as a function of the applied RF voltage. This non-linearity may add more crossmodulation and intermodulation products to that caused by active elements of the tuner.

Another problem inherent in varactor tuned frequency converters with a relatively high IF frequency (upconverter) is the difficulty of tracking the frequency between the RF and oscillator tuned circuits. To overcome this problem, complicated analog or digital schemes have been used.

On the other hand, a simple switching diode approach to band selection generally involves the use of separate bandpass filter sections that are selectively switched in and out of circuit depending upon the frequency band desired. In this switching diode approach, one bandpass filter section is generally active, while the remaining bandpass filter sections are switched out of circuit and are thus rendered inactive. Thus, the majority of circuit components are not in use at any given time and there is, consequently, a high component count for the various bandpass filter sections. In addition, more than one switching diode is generally required for each frequency band to allow for the switching in and out of circuit of both the input and the output of each bandpass filter section so as to select the circuit for receiving a desired frequency band.

In order to reduce the cross- and intermodulation products in wide band CATV tuners and signal converters, double balanced mixers are frequently employed. However, because the CATV band has expanded into the UHF band, the practical limits of double balanced mixer performance within the CATV tuner have essentially been reached in terms of tradeoff between intermodulation and noise performance. With this large RF bandwidth, mixer intermodulation and noise performance determine the dynamic range of the CATV tuner. The noise figure for a typical frequency converter chain with a mixer, which typically exhibits a conversion loss from 6 to 8 dB, is generally in the range of 10 to 13 dB. Placing a feedback type preamplifier with a gain of 10 dB in front of the mixer improves the system's noise figure to 5 to 7 dB, but decreases the signal converter's RF processing capability by an associated 10 dB. This decrease of the signal converter's RF processing capability is generally unacceptable, except where an electronic band switch is also placed in front of the mixer state. However, this capability has not generally been available without employing overly complicated switching arrangements with large numbers of electronic components.

The invention disclosed in U.S. Pat. No. 4,571,560 overcomes one or more of the aforementioned limitations of the prior art by providing a switchable bandpass filter which is capable of operating over a large bandwidth, which employs a relatively low number of components by using many of the components in each of the inactive, or bandstop, sections of the filter, and which utilizes only a single switching diode in each bandpass filter section.

As disclosed in the aforementioned patent, one of the bandpass filter sections is activated by reverse biasing its corresponding switching diode. The other switching diodes are forward biased in order to deactivate their corresponding bandpass filter sections. These forward biased switching diodes, however, conduct in parallel, which causes a relatively large power drain. Unfortunately, in some battery powered applications, such as where tuners are used in laptop computers and in other portable devices, a large power drain shortens the time that the device can operate off of a single battery charge.

The present invention reduces the power drain in a bandpass filter by coupling the filter controlling switches in series rather than in parallel to thereby reduce power drain. Furthermore, the elements (e.g., tri-state buffers) that control the switches may be integrated together with other functional blocks of a tuner. For example, it is customary to integrate all sorts of switching means within a frequency synthesizer IC while using the control bus of the latter also for the purpose of bandswitching thus minimizing the cost of the control circuits.

SUMMARY OF THE INVENTION

In accordance with one aspect of the present invention, a switchable filter for passing one of a plurality of frequency bands comprises a filter input terminal, a filter output terminal, n bandpass filter sections, and n switches. Each of the n bandpass filter sections is coupled between the filter input terminal and the filter output terminal, and each of the n bandpass filter sections is arranged to pass a different frequency band. Each of the n switches is coupled to a respective one of then bandpass filter sections, and each of the n switches is operable for assuming either an OFF state for activating a corresponding one of the n bandpass filter sections or an ON state for deactivating the corresponding one of the n bandpass filter sections. The n switches are arranged and controlled so that, when any one of the n switches is operated to its OFF state, the remaining n−1 switches are operated to their ON states and form a series circuit for conducting a common current, and n ∃ 3.

In accordance with another aspect of the present invention, a switchable filter for passing one of a plurality of frequency bands comprises a filter input terminal, a filter output terminal, at least first, second, and third bandpass filter sections, at least first, second, and third switches, and a controller. Each of the at least first, second, and third bandpass filter sections is coupled between the filter input terminal an the filter output terminal, and each of the at least first, second, and third bandpass filter sections is arranged to pass a different frequency band. The first switch is coupled in controlling relationship to the first bandpass filter section, the second switch is coupled in controlling relationship to the second bandpass filter section, and the third switch is coupled in controlling relationship to the third bandpass filter section. The controller is coupled to the at least first, second, and third switches. The controller controls the first switch to an OFF state so that the first bandpass filter section is activated and controls the second and third switches to ON states so that the second and third switches conduct in series so as to deactivate the second and third bandpass filter sections. The controller controls the second switch to an OFF state so that the second bandpass filter section is activated and controls the first and third switches to ON states so that the first and third switches conduct in series so as to deactivate the first and third bandpass filter sections. The controller controls the third switch to an OFF state so that the third bandpass filter section is activated and controls the first and second switches to ON states so that the fist and second switches conduct in series so as to deactivate the first and second bandpass filter sections.

In accordance with still another aspect of the present invention, a switchable filter for passing one of a plurality of frequency bands comprises a filter input terminal, a filter output terminal, first, second, third, and fourth bandpass filter sections, first, second, third, and fourth switches, and a controllers. The first bandpass filter section is coupled between the filter input terminal and the filter output terminal, and the first bandpass filter section is arranged to pass a first frequency band. The second bandpass filter section is coupled between the filter input terminal and the filter output terminal, and the second bandpass filter section is arranged to pass a second frequency band. The third bandpass filter section is coupled between the filter input terminal and the filter output terminal, and the third bandpass filter section is arranged to pass a third frequency band. The fourth bandpass filter section is coupled between the filter input terminal and the filter output terminal, and the fourth bandpass filter section is arranged to pass a fourth frequency band. The first, second, third, and fourth frequency bands are different. The first switch is coupled to the first bandpass filter section, the second switch is coupled to the second bandpass filter section, the third switch is coupled to the third bandpass filter section, and the fourth switch coupled to the fourth bandpass filter section. The controller is coupled to the first, second, third, and fourth switches. The controller controls the first switch so that the first bandpass filter section is activated and controls the second, third, and fourth switches so that the second, third, and fourth switches conduct current in series to deactivate the second, third, and fourth bandpass filter sections. The controller controls the second switch so that the second bandpass filter section is activated and controls the first, third, and fourth switches so that the first, third, and fourth switches conduct current in series to deactivate the first, third, and fourth bandpass filter sections. The controller controls the third switch so that the third bandpass filter section is activated and controls the first, second, and fourth switches so that the first, second, and fourth switches conduct current in series to deactivate the first, second, and fourth bandpass filter sections. The controller controls the fourth switch so that the fourth bandpass filter section is activated and controls the first, second, and third switches so that the first, second, and third switches conduct current in series to deactivate the first, second, and third bandpass filter sections.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
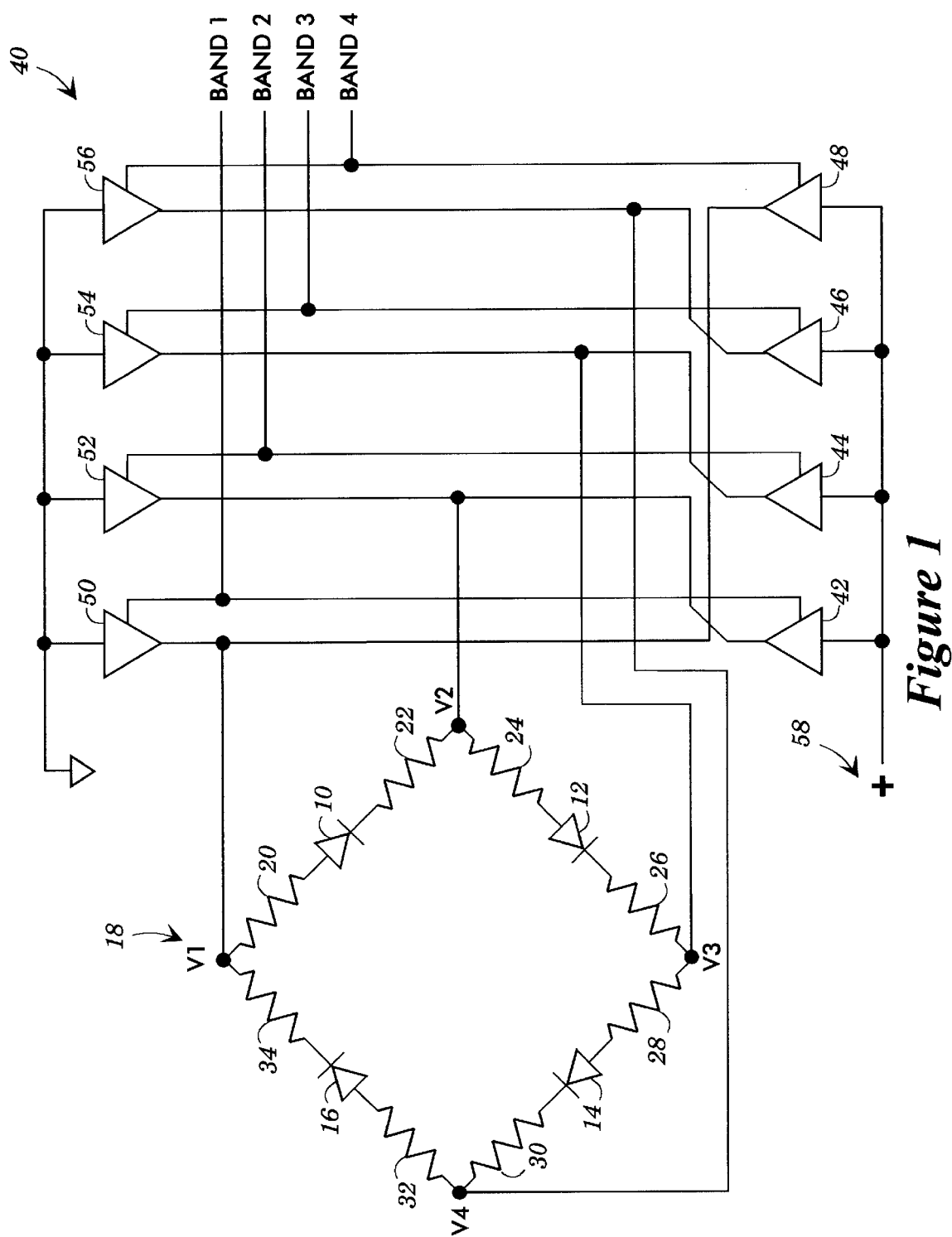
FIG. 1 illustrates a bridge arrangement for coupling the swtichgn diodes of a switchable bandpass filter in a series relationship.

As shown in FIG. 1, switching diodes 10, 12, 14, and 16 are coupled in a bridge 18 having four terminals V1, V2, V3, and V4. Specifically, a resistor 20 is coupled between the anode of the switching diode 10 and the terminal V1, and a resistor 22 is coupled between the cathode of the switching diode 10 and the terminal V2. A resistor 24 is coupled between the anode of the switching diode 12 and the terminal V2, and a resistor 26 is coupled between the cathode of the switching diode 12 and the terminal V3. A resistor 28 is coupled between the anode of the switching diode 14 and the terminal V3, and a resistor 30 is coupled between the cathode of the switching diode 14 and the terminal V4. Finally, a resistor 32 is coupled between the anode of the switching diode 16 and the terminal V4, and a resistor 34 is coupled between the cathode of the switching diode 16 and the terminal V1.

As explained below, a controller 40 selectively controls the bridge 18 so that one of four bandpass filter sections is active and so that the other three bandpass filter sections are inactive. For example, the controller 40 reverse biases the switching diode 10 in order to activate the bandpass filter section controlled by the switching diode 10 and forward biases the switching diodes 12, 14, and 16 in order to deactivate the bandpass filter sections correspondingly controlled by the switching diodes 12, 14, and 16. When the switching diodes 12, 14, and 16 are forward biased, they conduct in series between the terminals V2 and V1. Because the switching diodes 12, 14, and 16 conduct in series, they draw less power than the prior art switching diodes, which conduct in parallel.

The controller 40 includes eight tri-state buffers 42, 44, 46, 48, 50, 52, 54, and 56. The eight tri-state buffers 42, 44, 46, 48, 50, 52, 54, and 56 operate with one pair being ON and the other three pairs being OFF, as described below, in order to reverse bias a selected one of the diodes 10, 12, 14, and 16 and to forward bias the other three of the diodes 10, 12, 14, and 16. When each of the eight tri-state buffers 42, 44, 46, 48, 50, 52, 54, and 56 is OFF, it should have a very high impedance so that no current flow therethrough.

The four tri-state buffers 42, 44, 46, and 48 source current to the bridge 18, and the four tri-state buffers 50, 52, 54, and 56 sink current from the bridge 18. Thus, each of the input terminals of the tri-state buffers 42, 44, 46, and 48 is coupled to a positive source 58, such as a 5 volt source, and each of the input terminals of the tri-state buffers 50, 52, 54, and 56 is coupled to a reference potential, such as ground.

The eight tri-state buffers 42, 44, 46, 48, 50, 52, 54, and 56, for example, may be supplied under part number 74HC126 and may each comprises an input terminal, an output terminal, and an enable terminal.

The output terminals of the tri-state buffers 48 and 50 are coupled to the terminal V1 of the bridge 18, the output terminals of the tri-state buffers 42 and 52 are coupled to the terminal V2 of the bridge 18, the output terminals of the tri-state buffers 44 and 54 are coupled to the terminal V3 of the bridge 18, and the output terminals of the tri-state buffers 46 and 56 are coupled to the terminal V4 of the bridge 18.

The enable terminals of the tri-state buffers 42 and 50 are coupled to a BAND1 control terminal, the enable terminals of the tri-state buffers 44 and 52 are coupled to a BAND2 control terminal, the enable terminals of the tri-state buffers 46 and 54 are coupled to a BAND3 control terminal, and the enable terminals of the tri-state buffers 48 and 56 are coupled to a BAND4 control terminal.

Accordingly, when the BAND1 control terminal is high, the tri-state buffers 42 and 50 conduct so that the switching diode 10 is reversed biased and so that the switching diodes 12, 14, and 16 are forward biased. When the BAND2 control terminal is high, the tri-state buffers 44 and 52 conduct so that the switching diode 12 is reversed biased and so that the switching diodes 10, 14, and 16 are forward biased. When the BAND3 control terminal is high, the tri-state buffers 46 and 54 conduct so that the switching diode 14 is reversed biased and so that the switching diodes 10, 12, and 16 are forward biased. When the BAND4 control terminal is high, the tri-state buffers 48 and 56 conduct so that the switching diode 16 is reversed biased and the switching diodes 10, 2, and 14 are forward biased.

Figure 2:
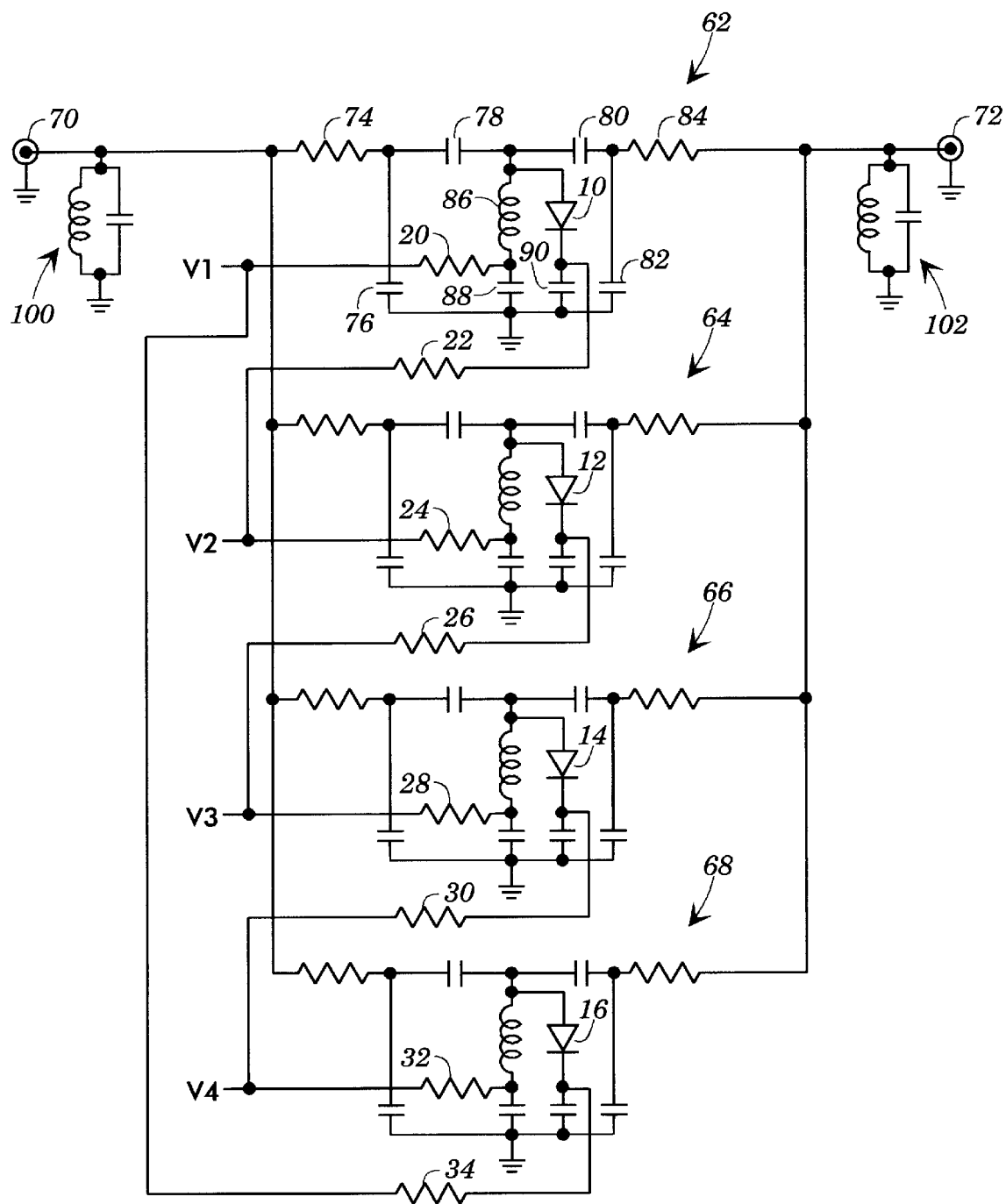
FIG. 2 is a schematic diagram of an exemplary switchable bandpass filter incorporating the bridge coupled switching diodes shown in FIG. 1; and, FIG. 3 shows the four overlapping attenuation curves of the switchable bandpass filter of FIG. 2 as a function of frequency and of the state of the switching diodes.

As shown in FIG. 2, a switchable bandpass filter 60 includes four bandpass filter sections 62, 64, 66 and 68 each of which is coupled to a filter input terminal 70 for selectively filtering RF signals provided to the filter input terminal 70. In the switchable bandpass filter 60, the bandpass filter sections 62, 64, 66 and 68 include the switching diodes 10, 12, 14, and 16 and the resistors 20, 22, 24, 26, 28, 30, 32, and 34 of the bridge 18. Each of the four bandpass filter sections 62, 64, 66, and 68 is tuned to a respective passband and is activated by a corresponding one of the switching diodes 10, 12, 14, and 16.

The switching diode 10 is responsive to the voltages at the terminals V1 and V2 in order to activate the bandpass filter section 62. The switching diode 12 is responsive to the voltages at the terminals V2 and V3 in order to activate the bandpass filter section 64. The switching diode 14 is responsive to the voltages at the terminals V3 and V4 in order to activate the bandpass filter section 66. The switching diode 16 is responsive to the voltages at the terminals V4 and V1 in order to activate the bandpass filter section 68.

The switchable bandpass filter 60 may be arranged to interface with a 50 to 75 ohm source and load, and can be switched between four states sequentially covering four partially overlapping frequency bands ranging from 50 to about 800 MHz with each band covering approximately one octave.

The operation and configuration of the bandpass filter section 62 within the switchable bandpass filter 60 is described herein, it being understood that the remaining three bandpass filter sections 64, 66, and 68 operate in a similar manner with different component values for the different frequency passbands. In addition, it should be understood that, while four bandpass filter sections coupled in parallel between the filter input terminal 70 and a filter output terminal 72 are shown in FIG. 2, the present invention is not limited to this number of bandpass filter sections and may instead include fewer or additional bandpass filter sections as desired or needed.

As can be seen from FIG. 2, the switchable bandpass filter 60 relies on some of the reactive components of all inactive bandpass filter sections in order to improve the stop-band suppression of the active bandpass filter section. The result of this arrangement is an efficient band switching network with good in-band matching and attenuation and steep out-of-band slopes.

Each of the bandpass filter sections 62, 64, 66, and 68 within the switchable bandpass filter 60 includes an input and an output series resonant circuit as well as a parallel resonant circuit. In the case of the bandpass filter section 62, the input series resonant circuit is comprised of an inductor 74 and capacitors 76 and 78. Similarly, the output series resonant circuit of the bandpass filter section 62 is comprised of capacitors 80 and 82 and an inductor 84. The parallel resonant circuit is comprised of an inductor 86 and the capacitors 76, 78, 80 and 82. A capacitor 88 provides an RF ground for one end of the inductor 86, and a capacitor 90 provides an RF ground for the cathode of the switching diode 10.

If it is desired to tune the switchable passband filter 60 to the passband BAND1, the BAND1 terminal of the controller 40 is driven high which causes the tri-state buffers 42 and 50 to conduct so as to drive the terminal V2 to the potential of the positive source 58 and to drive the terminal V1 to the reference potential. Accordingly, the switching diode 10 is reversed biased and the switching diodes 12, 14, and 16 are forward biased so that the switching diode 10 does not conduct and so that the switching diodes 12, 14, and 16 conduct. With the switching diodes 12, 14, and 16 conducting, the bandpass filter sections 64, 66, and 68 are deactivated.

On the other hand, with the switching diode 10 of the bandpass filter section 62 non-conducting, the bandpass filter section 62 is activated. Accordingly, the capacitors 76 and 78 form an input series resonant circuit with the inductor 74, the capacitors 80 and 82 form an output series resonant circuit with the inductor 84, and the capacitors 76, 78, 80, and 82 form a parallel resonant circuit with the inductor 86. The values of the components of these series and parallel resonant circuits are selected such that the bandpass filter section 62 is tuned to the center frequency of the desired passband BAND1.

With the bandpass filter sections 64, 66, and 68 thus rendered inactive by the switching diodes 12, 14, and 16, the parallel resonant circuits of the bandpass filter sections 64, 66, and 68 are thus removed from the bandpass filter sections 64, 66, and 68. Therefore, the frequency bands to which the inactive bandpass filter sections 64, 66, and 68 are tuned are not provided to the filter output terminal 72.

However, the input and output series resonant circuits of the inactive bandpass filter sections 64, 66, and 68 remain in circuit with the active bandpass filter section 62. Each of the series resonant circuits of the respective inactive bandpass filter sections 64, 66, and 68 is tuned to a notch frequency within the stopband of the active bandpass filter section 62.

The effect that the resonant circuits of the deactivated bandpass filter sections have on the activated bandpass filter section can be further understood by considering the series resonant filters of the switchable bandpass filter 60 when the bandpass filter section 64 is activated and the bandpass filter sections 62, 66, and 68 are deactivated. Thus, if it is desired to tune the switchable passband filter 60 to the passband BAND2, the BAND2 terminal of the controller 40 is driven high which cause the tri-state buffers 44 and 52 to conduct so as to drive the terminal V3 to the potential of the positive source 58 and to drive the terminal V2 to the reference potential. Accordingly, the switching diode 12 is reversed biased and the switching diodes 10, 14, and 16 are forward biased so that the switching diode 12 does not conduct and so that the switching diodes 10, 14, and 16 conduct. With the switching diodes 10, 14, and 16 conducting, the bandpass filter sections 62, 66, and 68 are deactivated.

With the switching diode 12 rendered nonconductive, the electrical configuration and operation of the bandpass filter section 64 is identical to that previously described with respect to the bandpass filter section 62. With the bandpass filter section 62 rendered deactivated by the switching diode 10, the capacitors 76 and 78 are arranged in parallel and together with the inductor 74 form a series resonant circuit across the input terminals. Similarly, the capacitors 80 and 82 are arranged in parallel and, in combination with the inductor 84, form a series resonant circuit across the output terminals. The parallel resonant circuit of the bandpass filter section 62 is removed from the bandpass filter section 62 when it is rendered inactive. The frequency band to which the bandpass filter section 62 is tuned is thus no longer provided to the filter output terminal 72, and its series resonant circuits, together with the series resonant circuits of the remaining inactive bandpass filter sections 66 and 68, remain in circuit with the active bandpass filter section 64. Each of the series resonant circuits of the respective inactive bandpass filter sections 62, 66, and 68 in tuned to a notch frequency within the stopband of the active bandpass filter section 64.

Figure 3:
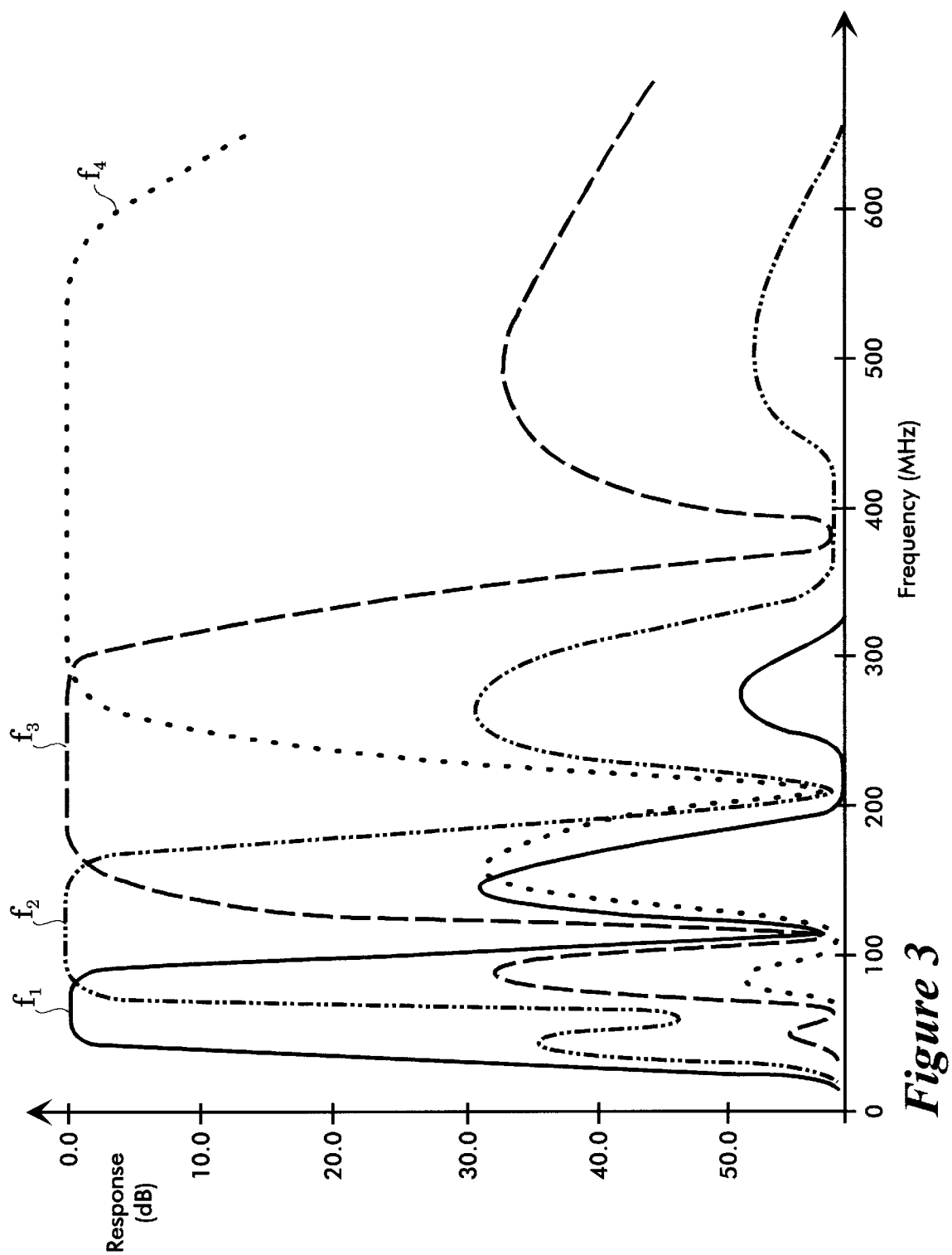

FIG. 3 shows a graphical representation of the response of the switched bandpass filter 60 over a range of frequencies. The frequency range shown in FIG. 3 is for a typical CATV converter whose frequency range extends from approximately 50 to more than 500 MHz. As shown in FIG. 3, the frequency response for each of the bandpass filter sections 62, 64, 66, and 68 is a separate response curve. For example, f1, f2, f3 and f4 represent the respective frequency responses of the bandpass filter sections 62, 64, 66, and 68. It can be seen that each of the f2, f3, and f4 response curves exhibits a notch frequency within the passband of f1. Similarly, the passband of f2 coincides with notch frequencies of the f1, f3 and f4 frequency response curves. The same is true of the response curves f3 and f4 which coincide with notch frequencies of the remaining response curves.

From the frequency response curves of FIG. 3, it can be seen that the series resonant circuit portions of the inactive bandpass sections cooperate with the active bandpass section to form notch circuits outside of the active band for improved stop-band suppression of the active bandpass section. This improved filtering of the received RF signals is made possible by using approximately two-thirds of the components of all of the inactive bandpass section in circuit with the active bandpass section to provide improved selective filtering of the received signal.

The filter input terminal 70 in FIG. 2 is shunted to ground by a parallel resonant circuit 100. Similarly, the filter output terminal 72 in FIG. 2 is shunted to ground by a parallel resonant circuit 102. The parallel resonant circuits 100 and 102 are identically tuned to a frequency between the lowest and the highest passband frequencies. The purpose of the parallel resonant circuits 100 and 102 is to improve the passband ripple for the highest and for the lowest passbands of the switchable bandpass filter 60.

There has thus been shown a switchable bandpass filter having a plurality of parallel bandpass filter sections each including input and output series resonant circuits as well as a parallel resonant circuit coupled therebetween. Each bandpass filter section further includes a switching diode coupled across the parallel resonant circuit for grounding the parallel resonant circuit so as to render the corresponding bandpass filter section inactive. Only one of the bandpass filter sections is active for passing a given frequency band, with the input and output series resonant circuit of the inactive bandpass filter sections complementing the active bandpass filter section by serving as notch filters outside of the active band for improving the stop-band suppression of the active bandpass filter section.

Certain modifications of the present invention have been discussed above. Other modifications will occur to those practicing in the art of the present invention. For example, as described above, the switching diodes 10, 12, 14, and 16 are used to activate the deactive the bandpass filter sections 62, 64, 66, and 68. However, other suitable forms to switches may be used instead of diodes for this purpose.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A switchable filter for passing one of a plurality of frequency bands comprising:

a filter input terminal;

a filter output terminal;

n bandpass filter sections, wherein each of the n bandpass filter sections is coupled between the filter input terminal and the filter output terminal, and wherein each of the n bandpass filter sections is arranged to pass a different frequency band;

n switches each coupled to a respective one of the n bandpass filter sections, wherein each of the n switches is operable for assuming either an OFF state for activating a corresponding one of the n bandpass filter sections or an ON state for deactivating the corresponding one of the n bandpass filter sections, wherein the n switches are arranged and controlled so that, when any one of the n switches is operated to its OFF state, the remaining n−1 switches are operated to their ON states and form a series circuit for conducting a common current, and wherein n≧3.

2. The switchable filter of claim 1 further comprising n control terminals, wherein each of the n switches comprises a diode, wherein a selective pair of the n control terminals is arranged to reverse bias one of the diodes so as to render the corresponding one of the n bandpass filter sections active and to forward bias the remaining n−1 diodes so as to render the remaining n−1 bandpass filter sections inactive.

3. The switchable filter of claim 2 further comprising n pairs of resistors, wherein each pair of resistors couples a corresponding one of the n diodes between a corresponding pair of the n control terminals.

4. The switchable filter of claim 2 wherein each of the n bandpass filter sections comprises a parallel resonant circuit, and wherein each of the parallel resonant circuits of the inactive bandpass filter sections is bypassed by a corresponding one of the n−1 diodes.

5. The switchable filter of claim 2 wherein each of the n bandpass filter sections comprises a parallel resonant circuit and at least one series resonant circuit, wherein each of the parallel resonant circuits of the inactive bandpass filter sections is bypassed by a corresponding one of the n−1 diodes, and wherein the series resonant circuits of the inactive bandpass filter sections form notch filters for the active bandpass filter section.

6. The switchable filter of claim 2 wherein each of the n bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein each of the parallel resonant circuits of the inactive bandpass filter sections is bypassed by a corresponding one of the n−1 diodes, and wherein the first and second series resonant circuits of the inactive bandpass filter sections form notch filters for the active bandpass filter section.

7. The switchable filter of claim 2 wherein each of the n bandpass filter sections comprises at least one series resonant circuit, and wherein the series resonant circuits of the inactive bandpass filter sections form notch filters for the active bandpass filter section.

8. The switchable filter of claim 1 wherein each of the n bandpass filter sections comprises a parallel resonant circuit, and wherein each of the parallel resonant circuits of the inactive bandpass filter sections is bypassed by a corresponding one of the n−1 switches.

9. The switchable filter of claim 1 wherein each of the n bandpass filter sections comprises a parallel resonant circuit and at least one series resonant circuit, wherein each of the parallel resonant circuits of the inactive bandpass filter sections is bypassed by a corresponding one of the n−1 switches, and wherein the series resonant circuits of the inactive bandpass filter sections form notch filters for the active bandpass filter section.

10. The switchable filter of claim 1 wherein each of the n bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein each of the parallel resonant circuits of the inactive bandpass filter sections is bypassed by a corresponding one of the n−1 switches, and wherein the first and second series resonant circuits of the inactive bandpass filter sections form notch filters for the active bandpass filter section.

11. The switchable filter of claim 1 wherein each of the n bandpass filter sections comprises at least one series resonant circuit, and wherein the series resonant circuits of the inactive bandpass filter sections form notch filters for the active bandpass filter section.

12. A switchable filter for passing one of a plurality of frequency bands comprising:
a filter input terminal;
a filter output terminal;
at least first, second, and third bandpass filter sections, wherein each of the at least first, second, and third bandpass filter sections is coupled between the filter input terminal and the filter output terminal, and wherein each of the at least first, second, and third bandpass filter sections is arranged to pass a different frequency band;
at least first, second, and third switches, wherein the first switch is coupled in controlling relationship to the first bandpass filter section, wherein the second switch is coupled in controlling relationship to the second bandpass filter section, and wherein the third switch is coupled in controlling relationship to the third bandpass filter section; and,
a controller coupled to the at least first, second, and third switches, wherein the controller is arranged to control the first switch to an OFF state so that the first bandpass filter section is activated and to control the second and third switches to ON states so that the second and third switches conduct in series so as to deactivate the second and third bandpass filter sections, wherein the controller is arranged to control the second switch to an OFF state so that the second bandpass filter section is activated and to control the first and third switches to ON states so that the first and third switches conduct in series so as to deactivate the first and third bandpass filter sections, and wherein the controller is arranged to control the third switch to an OFF state so that the third bandpass filter section is activated and to control the first and second switches to ON states so that the first and second switches conduct in series so as to deactivate the first and second bandpass filter sections.

13. The switchable filter of claim 12 further comprising at least three control terminals, wherein the first, second, and third switches comprise corresponding first, second, and third diodes, wherein a first selective pair of the at least three control terminals is arranged to reverse bias the first diode so as to render the first bandpass filter section active and to forward bias the second and third diodes so as to render the second and third bandpass filter sections inactive, wherein a second selective pair of the at least three control terminals is arranged to reverse bias the second diode so as to render the second bandpass filter section active and to forward bias the first and third diodes so as to render the first and third bandpass filter sections inactive, and wherein a third selective pair of the at least three control terminals is arranged to reverse bias the third diode so as to render the third bandpass filter section active and to forward bias the first and second diodes so as to render the first and second bandpass filter sections inactive.

14. The switchable filter of claim 13 further comprising at least three pairs of resistors, wherein each pair of resistors couples a corresponding one of the first, second, and third diodes between a corresponding pair of the three control terminals.

15. The switchable filter of claim 13 wherein each of the first, second, and third bandpass filter sections comprises a parallel resonant circuit, wherein the controller is arranged to control the first diode so that the first bandpass filter section is activated and to control the second and third diodes so that the parallel resonant circuits of the second and third bandpass filter sections are bypassed, wherein the controller is arranged to control the second diode so that the second bandpass filter section is activated and to control the first and third diodes so that the parallel resonant circuits of the first and third bandpass filter sections are bypassed, and wherein the controller is arranged to control the third diode so that the third bandpass filter section is activated and to control the first and second diodes so that the parallel resonant circuits of the first and second bandpass filter sections are bypassed.

16. The switchable filter of claim 13 wherein each of the first, second, and third bandpass filter sections comprises a parallel resonant circuit and at least one series resonant circuit, wherein the controller is arranged to control the first diode so that the first bandpass filter section is activated and to control the second and third diodes so that the parallel resonant circuits of the second and third bandpass filter sections are bypassed and so that the series resonant circuits of the second and third bandpass filter sections form notch filters for the first bandpass filter section, wherein the controller is arranged to control the second diode so that the second bandpass filter section is activated and to control the first and third diodes so that the parallel resonant circuits of the first and third bandpass filter sections are bypassed and so that the series resonant circuits of the first and third bandpass filter sections form notch filters for the second bandpass filter section, and wherein the controller is arranged to control the third diode so that the third bandpass filter section is activated and to control the first and second diodes so that the parallel resonant circuits of the first and second bandpass filter sections are bypassed and so that the series resonant circuits of the first and second bandpass filter sections form notch filters for the third bandpass filter section.

17. The switchable filter of claim 13 wherein each of the first, second, and third bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein the controller is arranged to control the first diode so that the first bandpass filter section is activated and to control the second and third diodes so that the parallel resonant circuits of the second and third bandpass filter sections are bypassed and so that the first and second series resonant circuits of the second and third bandpass filter sections form notch filters for the first bandpass filter section, wherein the controller is arranged to control the second diode so that the second bandpass filter section is activated and to control the first and third diodes so that the parallel resonant circuits of the first and third bandpass filter sections are bypassed and so that the first and second series resonant circuits of the first and third bandpass filter sections form notch filters for the second bandpass filter section, and wherein the controller is arranged to control the third diode so that the third bandpass filter section is activated and to control the first and second diodes so that the parallel resonant circuits of the first and second bandpass filter sections are bypassed and so that the first and second series resonant circuits of the first and second bandpass filter sections form notch filters for the third bandpass filter section.

18. The switchable filter of claim 13 wherein each of the first, second, and third bandpass filter sections comprises at least one series resonant circuit, wherein the controller is arranged to control the first diode so that the first bandpass filter section is activated and so that the series resonant circuits of the second and third bandpass filter sections form notch filters for the first bandpass filter section, wherein the controller is arranged to control the second diode so that the second bandpass filter section is activated and so that the series resonant circuits of the first and third bandpass filter sections form notch filters for the second bandpass filter section, and wherein the controller is arranged to control the third diode so that the third bandpass filter section is activated and so that the series resonant circuits of the first and second bandpass filter sections form notch filters for the third bandpass filter section.

19. The switchable filter of claim 12 wherein each of the first, second, and third bandpass filter sections comprises a parallel resonant circuit, wherein the controller is arranged to control the first switch so that the first bandpass filter section is activated and to control the second and third switches so that the parallel resonant circuits of the second and third bandpass filter sections are bypassed, wherein the controller is arranged to control the second switch so that the second bandpass filter section is activated and to control the first and third switches so that the parallel resonant circuits of the first and third bandpass filter sections are bypassed, and wherein the controller is arranged to control the third switch so that the third bandpass filter section is activated and to control the first and second switches so that the parallel resonant circuits of the first and second bandpass filter sections are bypassed.

20. The switchable filter of claim 12 wherein each of the first, second, and third bandpass filter sections comprises a parallel resonant circuit and at least one series resonant circuit, wherein the controller is arranged to control the first switch so that the first bandpass filter section is activated and to control the second and third switches so that the parallel resonant circuits of the second and third bandpass filter sections are bypassed and so that the series resonant circuits of the second and third bandpass filter sections form notch filters for the first bandpass filter section, wherein the controller is arranged to control the second switch so that the second bandpass filter section is activated and to control the first and third switches so that the parallel resonant circuits of the first and third bandpass filter sections are bypassed and so that the series resonant circuits of the first and third bandpass filter sections form notch filters for the second bandpass filter section, and wherein the controller is arranged to control the third switch so that the third bandpass filter section is activated and to control the first and second switches so that the parallel resonant circuits of the first and second bandpass filter sections are bypassed and so that the series resonant circuits of the first and second bandpass filter sections form notch filters for the third bandpass filter section.

21. The switchable filter of claim 12 wherein each of the first, second, and third bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein the controller is arranged to control the first switch so that the first bandpass filter section is activated and to control the second and third switches so that the parallel resonant circuits of the second and third bandpass filter sections are bypassed and so that the first and second series resonant circuits of the second and third bandpass filter sections form notch filters for the first bandpass filter section, and wherein the controller is arranged to control the second switch so that the second bandpass filter section is activated and to control the first and third switches so that the parallel resonant circuits of the first and third bandpass filter sections are bypassed and so that the first and second series resonant circuits of the first and third bandpass filter sections form notch filters for the second bandpass filter section, and wherein the controller is arranged to control the third switch so that the third bandpass filter section is activated and to control the first and second switches so that the parallel resonant circuits of the first and second bandpass filter sections are bypassed and so that the first and second series resonant circuits of the first and second bandpass filter sections form notch filters for the third bandpass filter section.

22. The switchable filter of claim 12 wherein each of the first, second, and third bandpass filter sections comprises at least one series resonant circuit, wherein the controller is arranged to control the first switch so that the first bandpass filter section is activated and so that the series resonant circuits of the second and third bandpass filter sections form notch filters for the first bandpass filter section, wherein the controller is arranged to control the second switch so that the second bandpass filter section is activated and so that the series resonant circuits of the first and third bandpass filter sections form notch filters for the second bandpass filter section, and wherein the controller is arranged to control the third switch so that the third bandpass filter section is activated and so that the series resonant circuits of the first and second bandpass filter sections form notch filters for the third bandpass filter section.

23. The switchable filter of claim 12 wherein the controller comprises at least first, second, and third pairs of tri-state buffers coupled to the first, second, and third switches such that one of the pairs of tri-state buffers has a low impedance state and the other two pairs of tri-state buffers have high impedance states when a selected one of the first, second, and third switches is in the OFF state and the other two of the first, second, and third switches are in the ON state, and wherein the tri-state buffers conduct essentially no current when in the high impedance state.

24. A switchable filter for passing one of a plurality of frequency bands comprising:

a filter input terminal;

a filter output terminal;

a first bandpass filter section coupled between the filter input terminal and the filter output terminal, wherein the first bandpass filter section is arranged to pass a first frequency band;

a second bandpass filter section coupled between the filter input terminal and the filter output terminal, wherein the second bandpass filter section is arranged to pass a second frequency band;

a third bandpass filter section coupled between the filter input terminal and the filter output terminal, wherein the third bandpass filter section is arranged to pass a third frequency band;

a fourth bandpass filter section coupled between the filter input terminal and the filter output terminal, wherein the fourth bandpass filter section is arranged to pass a fourth frequency band, wherein the first, second, third, and fourth frequency bands are different;

a first switch coupled to the first bandpass filter section;

a second switch coupled to the second bandpass filter section;

a third switch coupled to the third bandpass filter section;

a fourth switch coupled to the fourth bandpass filter section; and, a controller coupled to the first, second, third, and fourth switches, wherein the controller is arranged to control the first switch so that the first bandpass filter section is activated and to control the second, third, and fourth switches so that the second, third, and fourth switches conduct current in series to deactivate the second, third, and fourth bandpass filter sections, wherein the controller is arranged to control the second switch so that the second bandpass filter section is activated and to control the first, third, and fourth switches so that the first, third, and fourth switches conduct current in series to deactivate the first, third, and fourth bandpass filter sections, wherein the controller is arranged to control the third switch so that the third bandpass filter section is activated and to control the first, second, and fourth switches so that the first, second, and fourth switches conduct current in series to deactivate the first, second, and fourth bandpass filter sections, and wherein the controller is arranged to control the fourth switch so that the fourth bandpass filter section is activated and to control the first, second, and third switches so that the first, second, and third switches conduct current in series to deactivate the first, second, and third bandpass filter sections.

25. The switchable filter of claim 24 further comprising first, second, third, and fourth control terminals, wherein the first, second, third, and fourth switches comprise corresponding first, second, third, and fourth diodes, wherein the first and second control terminals are arranged to reverse bias the first diode so as to render the first bandpass filter section active and to forward bias the second, third, and fourth diodes so as to render the second, third, and fourth bandpass filter sections inactive, wherein the second and third control terminals are arranged to reverse bias the second diode so as to render the second bandpass filter section active and to forward bias the first, third, and fourth diodes so as to render the first, third, and fourth bandpass filter sections inactive, wherein the third and fourth control terminals are arranged to reverse bias the third diode so as to render the third bandpass filter section active and to forward bias the first, second, and fourth diodes so as to render the first, second, and fourth bandpass filter sections inactive, and wherein the fourth and first control terminals are arranged to reverse bias the fourth diode so as to render the fourth bandpass filter section active and to forward bias the first, second, and third diodes so as to render the first, second, and third bandpass filter sections inactive.

26. The switchable filter of claim 25 further comprising first, second, third, and fourth pairs of resistors, wherein the first pair of resistors couples the first diode between the first and second control terminals, wherein the second pair of resistors couples the second diode between the second and third control terminals, wherein the third pair of resistors couples the third diode between the third and fourth control terminals, and wherein the fourth pair of resistors couples the fourth diode between the fourth and first control terminals.

27. The switchable filter of claim 25 wherein each of the first, second, third, and fourth bandpass filter sections comprises a parallel resonant circuit, wherein the controller is arranged to control the first diode so that the first bandpass filter section is activated and so that the parallel resonant circuits of the second, third, and fourth bandpass filter sections are bypassed, wherein the controller is arranged to control the second diode so that the second bandpass filter section is activated and so that the parallel resonant circuits of the first, third, and fourth bandpass filter sections are bypassed, wherein the controller is arranged to control the third diode so that the third bandpass filter section is activated and so that the parallel resonant circuits of the first, second, and fourth bandpass filter sections are bypassed, and wherein the controller is arranged to control the fourth diode so that the fourth bandpass filter section is activated and so that the parallel resonant circuits of the first, second, and third bandpass filter sections are bypassed.

28. The switchable filter of claim 25 wherein each of the first, second, third, and fourth bandpass filter sections comprises a parallel resonant circuit and at least one series resonant circuit, wherein the controller is arranged to control the first diode so that the first bandpass filter section is activated, so that the parallel resonant circuits of the second, third, and fourth bandpass filter sections are bypassed, and so that the series resonant circuits of the second, third, and fourth bandpass filter sections form notch filters for the first bandpass filter section, wherein the controller is arranged to control the second diode so that the second bandpass filter section is activated, so that the parallel resonant circuits of the first, third, and fourth bandpass filter sections are bypassed, and so that the series resonant circuits of the first, third, and fourth bandpass filter sections form notch filters for the second bandpass filter section, wherein the controller is arranged to control the third diode so that the third bandpass filter section is activated, so that the parallel resonant circuits of the first, second, and fourth bandpass filter sections are bypassed, and so that the series resonant circuits of the first, second, and fourth bandpass filter sections form notch filters for the third bandpass filter section, and wherein the controller is arranged to control the fourth diode so that the fourth bandpass filter section is activated, so that the parallel resonant circuits of the first, second, and third bandpass filter sections are bypassed, and so that the series resonant circuits of the first, second, and third bandpass filter sections form notch filters for the fourth bandpass filter section.

29. The switchable filter of claim 25 wherein each of the first, second, third, and fourth bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein the controller is arranged to control the first diode so that the first bandpass filter section is activated, so that the parallel resonant circuits of the second, third, and fourth bandpass filter sections are bypassed, and so that the first and second series resonant circuits of the second, third, and fourth bandpass filter sections form notch filters for the first bandpass filter section, wherein the controller is arranged to control the second diode so that the second bandpass filter section is activated, so that the parallel resonant circuits of the first, third, and fourth bandpass filter sections are bypassed, and so that the first and second series resonant circuits of the first, third and fourth bandpass filter sections form notch filters for the second bandpass filter section, wherein the controller is arranged to control the third diode so that the third bandpass filter section is activated, so that the parallel resonant circuits of the first, second, and fourth bandpass filter sections are bypassed, and so that the first and second series resonant circuits of the first, second, and fourth bandpass filter sections form notch filters for the third bandpass filter section, and wherein the controller is arranged to control the fourth diode so that the fourth bandpass filter section is activated, so that the parallel resonant circuits of the first, second, and third bandpass filter sections are bypassed, and so that the first and second series resonant circuits of the first, second, and third bandpass filter sections form notch filters for the fourth bandpass filter section.

30. The switchable filter of claim 25 wherein each of the first, second, third, and fourth bandpass filter sections comprises at least one series resonant circuit, wherein the controller is arranged to control the first diode so that the first bandpass filter section is activated and so that the series resonant circuits of the second, third, and fourth bandpass filter sections form notch filters for the first bandpass filter section, wherein the controller is arranged to control the second diode so that the second bandpass filter section is activated and so that the series resonant circuits of the first, third, and fourth bandpass filter sections form notch filters for the second bandpass filter section, wherein the controller is arranged to control the third diode so that the third bandpass filter section is activated and so that the series resonant circuits of the first, second, and fourth bandpass filter sections form notch filters for the third bandpass filter section, and wherein the controller is arranged to control the fourth diode so that the fourth bandpass filter section is activated and so that the series resonant circuits of the first, second, and third bandpass filter sections form notch filters for the fourth bandpass filter section.

31. The switchable filter of claim 24 wherein each of the first, second, third, and fourth bandpass filter sections comprises a parallel resonant circuit, wherein the controller is arranged to turn the first switch ON and the second, third, and fourth switches OFF so that the first bandpass filter section is activated and so that the parallel resonant circuits of the second, third, and fourth bandpass filter sections are bypassed, wherein the controller is arranged to turn the second switch ON and the first, third, and fourth switches OFF so that the second bandpass filter section is activated and so that the parallel resonant circuits of the first, third, and fourth bandpass filter sections are bypassed, wherein the controller is arranged to turn the third switch ON and the first, second, and fourth switches OFF so that the third bandpass filter section is activated and so that the parallel resonant circuits of the first, second, and fourth bandpass filter sections are bypassed, and wherein the controller is arranged to turn the fourth switch ON and the first, second, and third switches OFF so that the fourth bandpass filter section is activated and so that the parallel resonant circuits of the first, second, and third bandpass filter sections are bypassed.

32. The switchable filter of claim 24 wherein each of the first, second, third, and fourth bandpass filter sections comprises a parallel resonant circuit and at least one series resonant circuit, wherein the controller is arranged to turn the first switch ON and the second, third, and fourth switches OFF so that the first bandpass filter section is activated, so that the parallel resonant circuits of the second, third, and fourth bandpass filter sections are bypassed, and so that the series resonant circuits of the second, third, and fourth bandpass filter sections form notch filters for the first bandpass filter section, wherein the controller is arranged to turn the second switch ON and the first, third, and fourth switches OFF so that the second bandpass filter section is activated, so that the parallel resonant circuits of the first, third, and fourth bandpass filter sections are bypassed, and so that the series resonant circuits of the first, third, and fourth bandpass filter sections form notch filters for the second bandpass filter section, wherein the controller is arranged to turn the third switch ON and the first, second, and fourth switches OFF so that the third bandpass filter section is activated, so that the parallel resonant circuits of the first, second, and fourth bandpass filter sections are bypassed, and so that the series resonant circuits of the first, second, and fourth bandpass filter sections form notch filters for the third bandpass filter section, and wherein the controller is arranged to turn the fourth switch ON and the first, second, and third switches OFF so that the fourth bandpass filter section is activated, so that the parallel resonant circuits of the first, second, and third bandpass filter sections are bypassed, and so that the series resonant circuits of the first, second, and third bandpass filter sections form notch filters for the fourth bandpass filter section.

33. The switchable filter of claim 24 wherein each of the first, second, third, and fourth bandpass filter sections comprises a parallel resonant circuit, a first series resonant circuit coupled between the filter input terminal and the parallel resonant circuit, and a second series resonant circuit coupled between the filter output terminal and the parallel resonant circuit, wherein the controller is arranged to turn the first switch ON and the second, third, and fourth switches OFF so that the first bandpass filter section is activated, so that the parallel resonant circuits of the second, third, and fourth bandpass filter sections are bypassed, and so that the first and second series resonant circuits of the second, third, and fourth bandpass filter sections form notch filters for the first bandpass filter section, wherein the controller is arranged to turn the second switch ON and the first, third, and fourth switches OFF so that the second bandpass filter section is activated, so that the parallel resonant circuits of the first, third, and fourth bandpass filter sections are bypassed, and so that the first and second series resonant circuits of the first, third, and fourth bandpass filter sections form notch filters for the second bandpass filter section, wherein the controller is arranged to turn the third switch ON and the first, second, and fourth switches OFF so that the third bandpass filter section is activated, so that the parallel resonant circuits of the first, second, and fourth bandpass filter sections are bypassed, and so that the first and second series resonant circuits of the first, second, and fourth bandpass filter sections form notch filters for the third bandpass filter section, and wherein the controller is arranged to turn the fourth switch ON and the first, second, and third switches OFF so that the fourth bandpass filter section is activated, so that the parallel resonant circuits of the first, second, and third bandpass filter sections are bypassed, and so that the first and second series resonant circuits of the first, second, and third bandpass filter sections form notch filters for the fourth bandpass filter section.

34. The switchable filter of claim 24 wherein each of the first, second, third, and fourth bandpass filter sections comprises at least one series resonant circuit, wherein the controller is arranged to turn the first switch ON and the second, third, and fourth switches OFF so that the first bandpass filter section is activated and so that the series resonant circuits of the second, third, and fourth bandpass filter sections form notch filters for the first bandpass filter section, wherein the controller is arranged to turn the second switch ON and the first, third, and fourth switches OFF so that the second bandpass filter section is activated and so that the series resonant circuits of the first, third, and fourth bandpass filter sections form notch filters for the second bandpass filter section, wherein the controller is arranged to turn the fourth switch ON and the first, second, and fourth switches OFF so that the third bandpass filter section is activated and so that the series resonant circuits of the first, second, and fourth bandpass filter sections form notch filters for the third bandpass filter section, and wherein the controller is arranged to turn the fourth switch ON and the first, second, and third switches OFF so that the fourth bandpass filter section is activated and so that the series resonant circuits of the first, second, and third bandpass filter sections form notch filters for the fourth bandpass filter section.

35. The switchable filter of claim 24 wherein the controller comprises first, second, third, and fourth pairs of tri-state buffers coupled to the first, second, third, and fourth switches such that one of the pairs of tri-state buffers has a low impedance state and the other three pairs of tri-state buffers have high impedance states when a selected one of the first, second, third, and fourth switches is in the OFF state and the other two of the first, second, third, and fourth switches are in the ON state, and wherein the tri-state buffers conduct essentially no current when in the high impedance state.

* * * * *